United States Patent
Mai et al.

(10) Patent No.: US 9,224,581 B2
(45) Date of Patent: Dec. 29, 2015

(54) PARALLEL PLATE REACTOR FOR UNIFORM THIN FILM DEPOSITION WITH REDUCED TOOL FOOT-PRINT

(75) Inventors: Joachim Mai, Nobitz (DE); Benjamin Strahm, Giez (CH); Guillaume Wahli, Ecublens (CH); Arthur Buechel, Ruggell (LI); Thomas Schulze, Oelsnitz/Erzgeb. (DE)

(73) Assignee: Roth & Rau AG, Hohenstein-Ernstthal (DE)

( * ) Notice: Subject to any disclaimer, the term of this patent is extended or adjusted under 35 U.S.C. 154(b) by 0 days.

(21) Appl. No.: 13/577,701

(22) PCT Filed: Jul. 9, 2010

(86) PCT No.: PCT/IB2010/053138
§ 371 (c)(1),
(2), (4) Date: Aug. 8, 2012

(87) PCT Pub. No.: WO2011/095846
PCT Pub. Date: Aug. 11, 2011

(65) Prior Publication Data
US 2012/0304933 A1 Dec. 6, 2012

(30) Foreign Application Priority Data
Feb. 8, 2010 (EP) .................... 10401018

(51) Int. Cl.
*H01J 37/32* (2006.01)
*C23C 16/455* (2006.01)
*C23C 16/509* (2006.01)

(52) U.S. Cl.
CPC ..... *H01J 37/32449* (2013.01); *C23C 16/45565* (2013.01); *C23C 16/5096* (2013.01); *H01J 37/32091* (2013.01)

(58) Field of Classification Search
USPC .................... 118/715, 722, 723 R, 723 E; 156/345.43–345.47; 315/111.21
See application file for complete search history.

(56) References Cited

U.S. PATENT DOCUMENTS

| | | | |
|---|---|---|---|
| 5,728,223 A * | 3/1998 | Murakami et al. | 118/715 |
| 5,928,427 A | 7/1999 | Hwang | |
| 6,106,625 A * | 8/2000 | Koai et al. | 118/715 |
| 6,132,512 A | 10/2000 | Horie et al. | |
| 6,250,250 B1 | 6/2001 | Maishev et al. | |
| 6,942,753 B2 | 9/2005 | Choi et al. | |
| 7,743,731 B2 | 6/2010 | Enomoto et al. | |

(Continued)

FOREIGN PATENT DOCUMENTS

| | | |
|---|---|---|
| CN | 1754008 A | 3/2006 |
| CN | 101460655 A | 6/2009 |

(Continued)

*Primary Examiner* — Maureen Passey
(74) *Attorney, Agent, or Firm* — Laurence A. Greenberg; Werner H. Stemer; Ralph E. Locher

(57) ABSTRACT

A capacitive-coupled parallel plate plasma enhanced chemical vapor deposition reactor includes a gas distribution unit that is integrated in an RF electrode and is formed with a gas outlet. The parallel plate reactor is configured so that layers with high thickness homogeneity and quality can be produced. The capacitively coupled parallel plate plasma enhanced vapor deposition reactor has gas distribution unit with a multiple-stage showerhead constructed in such a way that it provides an independent adjustment of gas distribution and gas emission profile of the gas distribution unit.

10 Claims, 6 Drawing Sheets

(56) References Cited

U.S. PATENT DOCUMENTS

| | | |
|---|---|---|
| 7,935,429 B2 | 5/2011 | Park et al. |
| 2003/0047282 A1 | 3/2003 | Sago et al. |
| 2004/0123800 A1* | 7/2004 | Schlottmann ................ 118/715 |
| 2006/0102283 A1* | 5/2006 | Kwon et al. ............. 156/345.24 |
| 2006/0278340 A1* | 12/2006 | Fischer .................... 156/345.47 |
| 2008/0141941 A1* | 6/2008 | Augustino et al. ........ 118/723 R |
| 2008/0302303 A1 | 12/2008 | Choi et al. |
| 2009/0159423 A1 | 6/2009 | Kudela et al. |
| 2013/0293855 A1 | 11/2013 | Takaiwa et al. |

FOREIGN PATENT DOCUMENTS

| | | |
|---|---|---|
| EP | 0717126 A2 | 6/1996 |
| EP | 0853138 A1 | 7/1998 |
| EP | 2360292 A1 | 8/2011 |
| JP | 09030893 A | 2/1997 |
| JP | 2001244256 A | 9/2001 |
| JP | 2005033167 A | 2/2005 |
| JP | 4312797 B2 | 8/2009 |
| JP | 512218 B2 | 2/2013 |

* cited by examiner

US 9,224,581 B2

PARALLEL PLATE REACTOR FOR UNIFORM THIN FILM DEPOSITION WITH REDUCED TOOL FOOT-PRINT

BACKGROUND OF THE INVENTION

Field of the Invention

The present invention relates to a capacitive-coupled parallel plate plasma enhanced chemical vapor deposition reactor, comprising a gas distribution unit being integrated in an RF electrode and comprising a gas outlet.

Capacitive-coupled plasma enhanced chemical vapor deposition (PECVD) reactors commonly are used to deposit thin films on substrates, such as semiconductor substrates for the fabrication of solar cells. It is important for a plasma fabrication process to be performed with high spatial uniformity of the surface of the substrate. That is, a deposition process should be performed so that the deposited material has uniform thickness and quality at all positions on the surface of the substrate.

The concept of such parallel plate reactors is characterized by an arrangement of parallel plate-like electrodes wherein these electrodes are arranged in a gas tight, closed and temperature controlled chamber. The closed chamber is connected to an own vacuum pumping system and has its own gas supply. The parallel plate reactor is often used in a vacuum chamber being provided with its own pumping system, too.

Commonly, an asymmetric RF voltage is used to provide a plasma generated in the parallel plate arrangement with electrical power. The RF voltage is provided by an RF generator. Typically, the used plasma excitation frequencies are in a region between 13 MHz to about 80 MHz. At least one of the both parallel electrodes, in particular the RF supplied electrode, has a gas distribution system to supply the reaction room in the parallel plate reactor with gas.

The reaction room of a parallel plate reactor is mostly defined by the dimensions and distance between the electrodes as well as by the walls of the reaction chamber. So called pumping grids provided sideways of the RF electrode are used for an electrical separation of the reaction room in the direction of the gas exhaustion. The pumping grids consist of an electrically conductive material and are gas impermeable. Often, two pumping grids are applied in an opposite arrangement. With that construction, a mutual symmetrical pump down of the reaction room is possible. The distance of the electrodes to each other is determined by the technological needs and is typically in a region between about 10 mm and 30 mm. Substrates to be processed are normally laid on a grounded electrode.

The technological advantage of a parallel plate reactor concept consists in the existence of a closed, defined reaction room and a small available gas buffer volume of supplied gases. Thus, the time between an ignition of the plasma until an adjustment of a state of equilibrium of the plasma chemical reactions and thereby the adjustment of a stationary gas composition in the reaction room is small. This is especially important for a defined deposition of very thin layers. An eventually existing layer gradient formed by the transient oscillation behavior of the plasma deposition processes will be strongly reduced thereby.

With a parallel plate reactor, necessary demands for cleanness and special requirements of certain processes can be easily fulfilled. By the consequent gas room separation between the parallel plate reactor and the vacuum chamber in which the reactor is placed, several magnitudes of pressure difference between the atmosphere and the process pressure are achieved. Thus, the partial pressure and thereby the influence of atmospheric gases on the preparation process can be strongly reduced. Moreover, a diversion of used process gases in the vacuum chamber and in adjacent chambers is impeded.

Very advantageous is also the possibility of a separate cleaning of the parallel plate reactor, independent from the surrounding room of the vacuum chamber. By the mostly compact assembly of the parallel plate reactor, a well performed thermal separation of the vacuum chamber is possible. Integrated wall heaters in the reactor are arranged for a homogenous temperature control of the substrates.

The effectivity of the surface processing by means of a parallel plate reactor is essentially dependent on the possible process parameters and the requirements to homogeneity accomplishable therewith. Important process parameters are for instance the plasma excitation frequency, the RF power, the process pressure, the entire gas flow as well as the mixing ratio of the used gases. For plasma enhanced chemical vapor deposition (PECVD), the reachable layer deposition rate is often of great importance. The layer deposition rate is mainly influenced by the used plasma excitation frequency and the RF power used thereby. The higher the excitation frequency, the higher is the density of electrons and ions in the plasma. Concurrently, the burning voltage over the electrode arrangement can be reduced, wherein the energy of the ions coming upon the surface of the substrates decreases therewith. Furthermore, the dissociation or the fragmentation of the used gases is more intensive at higher plasma excitation frequencies, whereby in particular higher deposition rates can be reached.

Many designs for improving spatial uniformity of plasma fabrication processes have been developed. Some designs such as U.S. patent application 2009/0159423 A1 concentrate on the formation of a uniform plasma density since asymmetry in plasma density is undesirable because it produces a corresponding asymmetry in the plasma process being performed on the substrate. It is furthermore necessary to provide in a plasma chamber a uniform gas distribution that can be achieved by a so called showerhead electrode. The showerhead consists of one or more gas distribution plates or diffusers with a plurality of holes forming numerous gas outlet passage ways in the showerhead. The showerhead combines the functions of an RF electrode and a gas distribution in one unit.

Due to the holes in the plate of the showerhead electrode there is often, dependent on the velocity of the gas flow through the holes and the cross-section of the holes, an "image" of the holes distribution in the gas distribution plate on the layer deposited on the substrate by means of the showerhead. That is, the deposited layer is formed with a wavelike surface, wherein the wave crests are formed directly under the holes.

Furthermore, the known reactors often suffer from a non-complete shielding of the ambient of the reactor, resulting in an unwanted insert of particles into the reactor chamber.

BRIEF SUMMARY OF THE INVENTION

It is therefore the object of the present invention to provide capacitive-coupled parallel plate plasma enhanced chemical vapor deposition reactor of the above referenced type with what layers with high thickness homogeneity and quality can be produced.

The object is solved by a capacitive-coupled parallel plate plasma enhanced vapor deposition reactor, comprising a gas distribution unit being integrated in an RF electrode and comprising a gas outlet, wherein the gas distribution unit comprises a multiple-stage showerhead constructed in such a way that it provides an independent adjustment of gas distribution and gas emission profile of the gas distribution unit.

The gas distribution in the deposition area of a parallel plate reactor is predominantly dependent on the concrete conditions of the gas supply of fresh gases and the special conditions of gas outlet of used gases or decomposition products of the used gases which do not contribute to a further layer formation. As mentioned above, in known showerheads used in parallel plate reactors, the gas emission profile was directly dependent from the gas distribution provided by the respective gas distribution unit and lead to the above described wavelike surface profile of the deposited layers. In contrast to that, the present invention suggests a gas distribution unit which comprises a showerhead construction separating the gas distribution from the formation of the gas emission profile and therefore being able to adjust the gas distribution on one hand and to provide a certain gas emission profile on the other hand independently from each other. This results in a uniform layer deposition, especially in the case of thin films.

Preferentially, the inventive concept can be implemented by a capacitive-coupled parallel plate plasma enhanced vapor deposition reactor, comprising a gas distribution unit being integrated in an RF electrode and comprising a gas outlet, wherein the gas distribution unit comprises in the direction of the gas flow through the reactor at least one perforated first gas distribution plate and at least one perforated second gas distribution plate being spaced from the first gas distribution plate, the holes in the second gas distribution plate being constructed with a larger cross-section than the holes in the first gas distribution plate, and wherein separated gas buffer volumes are provided between single holes or groups of holes of the first gas distribution plate and the second gas distribution plate in which the gas buffer volumes connect them, respectively, wherein the gas buffer volumes are constructed with a larger cross-section than the holes in the second gas distribution plate.

The necessary requirements of the gas supply for an adjustment of a homogeneous layer deposition can be reached in the present invention by locally adapted patterns opposite to the deposition area and by individual dimensions of the gas holes in the different plates of the showerhead. According to the present invention, the dimensioning of the gas holes is made in such a way that the gas amount flowing through each of the gas holes is defined in dependence on the entire gas flow which is necessary for the plasma process. For this reason, a corresponding gas buffer inside the electrode formed by the separated gas buffer volumes between the holes of the first and the second gas distribution plates is used, leading to the effect that the gas flow can provide a sufficient gas amount for each individual gas hole.

The invention offers the possibility to provide a favorite gas management and to adjust therewith the profile of the layers deposited on the substrates. The first gas distribution plate of the showerhead serves due to its small holes as a plate with a low gas conductance leading to a relatively small gas flow diameter of the gas flow escaping from the holes of the first plate. If this gas flow would impact the surface of the substrates directly, areas on the substrates lying below that gas flow would be deposited with a higher layer thickness than other areas.

According to the present invention, the gas flow does not directly impinge on the surface of the substrate but flows into the gas buffer volume corresponding to each of the holes of the first gas distribution plate, respectively. The gas flow distributes in the room provided by the corresponding gas buffer volume following each hole of the first plate leading to an expansion of the gas flow diameter. As the gas buffer volumes connect the holes of the first and the second gas distribution plates, the gas flow passes thereafter through the holes in the second gas distribution plate of the showerhead. The second gas distribution plate is preferably in parallel to the first gas distribution plate and has a higher gas conductance than the first gas distribution plate by bigger holes formed in the second gas distribution plate. Therefore, the well distributed gas flows through the holes in the second gas distribution plate with a large spreading angle and a high uniformity.

By an appropriate choice of the gas flow conductance of the first and the second gas distribution plates, the gas flow leaving out of the holes of the second gas distribution plate can be adjusted in such a way that partial gas flows escaping from adjacent holes of the second gas distribution plate overlap and form on the surface of the underlying substrate a layer with a quite homogenous thickness. By the separation of the gas buffer volumes from each other it is furthermore realised that there does not occur an unwanted intermixture of gas flows escaping from the holes of the first gas distribution plate.

The principle of the present invention does also work with more than two gas distribution plates of the showerhead and in a case in which several holes of the first plate and/or the second plate are combined to groups of holes.

The reactor of the present invention can be realized in such a way that the holes in the second plate are constructed with a larger cross-section than the holes in the first plate, and the gas buffer volumes are constructed with a larger cross-section than the holes in the second plate. In that construction, the gas buffer volumes have a cylindrical form that can be constructed simply by drilling. In other embodiments of the invention, the sidewalls of the gas buffer volumes can be inclined so that the gas buffer volumes have a smaller diameter near the first plate and a larger diameter near the second plate. In any case, the gas buffer volumes are big and long enough to allow a balloon-like expansion of the gas flow in the gas buffer volume and a good distribution of gas in the gas buffer volume so that the gas can be lead nearly straight with a high homogeneity through the big holes in the second plate onto the substrate.

The relation between the hole's diameter of the holes in the second gas distribution plate to that of the holes in the first gas distribution plate can be easily adapted onto the respective requirements of the reactor and the parameters of deposited layers.

According to another embodiment of the present invention, the first gas distribution plate has such a gas flow conductance that it is able to produce a decrease of gas pressure being necessary to attain a gas blocking effect by the first gas distribution plate. To reach this, the gas flow conductance of each gas hole and the integral gas flow conductance of all of the holes of the first gas distribution plate is to adjust in such a way that a suitable gas pressure decrease results on the gas distribution unit. That gas pressure decrease should be adjusted so that the gas blocking effect known in the vacuum technology is reached for each hole.

The gas blocking effect is also known as a blocked flow which can be observed during an air ventilation of a vacuum box. During the opening of a venting valve, air flows from the ambience in the box with a certain pressure and with a high velocity. That velocity can reach at its maximum sonic velocity and the amount flowing there through is independent from the internal pressure of the box. To achieve that effect in the present invention, it is therefore recommendable to construct the holes of the first gas distribution plate with such a cross-section that the gas flowing through these holes during operation of the reactor reaches sonic velocity. Preferably, the dimensioning of the gas holes is made in such a way that the gas blocking effect will be maintained in the whole alteration area of the entire gas flow and the process pressure for all possible processes.

In a favorite embodiment of the present invention, for an attainment of the blocking effect, the first gas distribution plate comprises a perforated foil with a defined hole's arrangement.

For a suitable fixation of the perforated foil, in a further advancement of that embodiment an additional perforated plate can be used. That additional perforated plate can be used as a mask for the perforated foil to achieve an independent adjustment of the gas distribution and of the integral gas conductance of the selected holes in the foil therewith.

The first as well as the second gas distribution plate can be formed from two or more single plates lying upon another so that not only the gas distribution holes but also the gas buffer volumes between the holes can be formed by the special construction of the first and/or the second gas distribution plate.

Furthermore, the holes of the second gas distribution plate can be provided with countersinks on the side of the escape of gas and/or on the side of the gas inlet. Such countersinks can be used for a suitable adjustment of the gas emission profile of the gas distribution unit.

According to another example of the present invention, the hole density of the second gas distribution plate is higher at its edges, in a region close to pumping grids provided sideways on the RF electrode, respectively, than at the central part of the second gas distribution plate. In doing so, the gas flow is more direct and stronger at the edges of the plate. Increasing the flow on the edges helps replacing the lost energy due to friction of gas with the edges, which keeps the harmonic motion of the flow.

Furthermore, it can be useful to provide additional rows of holes of the gas distribution plates at an outer edge of the gas distribution unit, in the direction of the gas outlet of the reactor.

By an optimized dimensioning and arrangement of the individual gas holes, the gas flow velocity in the respective gas hole changes in dependence on the entire gas flow. That effect has a concurrent influence on the gas exit profile of the gas hole. In dependence on the amount of the flow velocity of the gas particles and the distance of the electrons to each other, a local layer thickness variance on the substrates can occur in the area of the gas holes. In that case, it can be necessary to control other process parameters.

For a homogeneous gas removal of the used gases out of the deposition region, in the direction of the gas outlet of the reactor, a homogeneous exhaust of gases through the pumping grids provided sideways on the RF electrode of the reactor is necessary. Normally, that will be reached by multiple gas exhausts arranged in the direction of the gas flow through the reactor after the pumping grids or by extensive devices allowing a flow correction. At high gas flow amounts and at a low distance of electrodes, a significant decrease of pressure can occur in the direction of the pumping grids in dependence on the respective process pressure. By high electrode dimensions and, therefore, long ways of the gas particles to the edge of the electrode and to the gas outlet, the reachable layer thickness homogeneity can also be decreased. To reduce that problem, a double-sided gas exhaust at the discharge gap of the parallel plate arrangement can be used and the gap between the electrodes can be adapted onto the respective technological requirements.

In a specific example of the present invention, gas pump down channels extending in the direction of the gas flow through the reactor are provided between the pumping grids provided sideways on the RF electrode, respectively, and the gas outlet of the reactor. The gas pump down channels provide a gas forcing unit behind the pumping grids by means of which a direct flow of gas toward the gas outlet orifice(s) of the reactor may be avoided. In this way, an new gas flow management at the back of the pumping grids can be provided, offering the possibility to achieve an almost perfect deposition uniformity over the complete deposition area of the parallel plate reactor.

In a variant of that embodiment, the pump down channels are formed by several parallel gas deflectors provided in the direction of the gas flow through the reactor behind the pumping grids. The gas deflectors force an elongated and straightened flow of gas towards the gas outlet. The usage of the gas deflectors is a method for reducing the gas flow perturbation within the plasma significantly.

Moreover, it has been shown that for reducing the effect of converging gas flow lines on plasma uniformity, the pumping zone should have a certain length. This length will be reduced in the present invention by applying a force on the gas flow in order to obtain a straight flow in the desired direction. This force is in this example of the present invention applied by using the gas deflectors in the way of gas out of the reactor. That is, these gas deflectors do not disturb the reaction and layer formation in the processing room of the reactor. The reduction of the pumping zone leads to the reduction of the footprint of the reactor for a given electrode area.

In an alternative embodiment of the present invention, the pump down channels can be integrated in at least one wall of the reactor to provide a relatively long pumping zone. In this case, it is especially recommendable to provide a pumping from top of the reactor. With such a design, the gas path length between the pumping grid and the pumping orifice can be extended while an extra-dimension in the deposition plane for this additional gas path can be minimized. Therefore, the proposed new gas exhaustion design makes it possible to improve significantly the foot-print of the reactor for a given deposition area without reducing the excellent deposition uniformity achieved by the long path length between the pumping grid and the gas outlet.

In a desired version of this embodiment of the invention, the gas deflectors comprise several parallel panels provided in the direction of the gas flow through the reactor behind the pumping grids. The panels can be rectangular panels installed to force the gas flow in the wanted flow direction. The usage of panel-shaped deflectors enables definite and easy directing the gas flow over a long distance. Thus, the use of the deflectors makes it possible to avoid any gas flow perturbation within the plasma due to converging gas flow lines towards the pumping orifices. Without the use of the deflectors, the pumping zone has to be long enough to reduce the effect of converging gas flow lines towards the pumping orifices on the plasma uniformity. Therefore, the use of the deflectors allows a reduction of the foot-print of the reactor for a given electrode area by avoiding a large pumping zone. The achievement of a highly directed gas flow depends on the length of the panels. By increasing the length of the panels, a better direction of gas flow can be obtained.

In a further option of the present invention, at least one additional grid is provided between the pumping grids and the gas outlet of the reactor, said additional grid having a reduced gas flow conductance in comparison with the pumping grid. The additional grid with smaller gas flow conductance enables keeping the direction and increasing the accuracy of gas flow produced by the pumping grid.

Preferably, the additional grid has such an integral gas flow conductance that said grid is able to produce at a preset gas flow a decrease of gas pressure being necessary to attain a gas blocking effect as mentioned above. It is furthermore possible to dimension the pumping grids of the reactor so that the gas blocking effect is provided by the pumping grids a t a preset gas flow.

In a preferred version of the present invention, the gas outlet orifice of the reactor is provided in a deposition plane or on top of the reactor. Providing the outlet orifice on the in a deposition plane is the most optimum method for obtaining a directed flow due to the very short distance between the deflectors and the outlet orifice. Installing the outlet orifice on the top provides a very long distance between it and the inlet orifice, which acts for redirecting the flow over the distance.

In the case of large scale depositions of thin layers with a parallel plate reactor, the achievable homogeneity of the deposition is mainly influenced by the plasma and gas distribution in the area of the deposition between the parallel electrode arrangement. The plasma distribution is strongly dependent from the homogeneous voltage and current distribution at the electrodes. Depending on the dimension of the electrodes and the used plasma excitation frequency, the homogeneity of the plasma formation can be mostly adapted onto the respective requirements by a skilful choice of the RF power supply position or, in the case where there are more than one place with a RF supply, of the positions of the RF power supply devices. By the increased electrical influence of the grounded side walls on the RF electrode in an edge area of the electrode arrangement, a homogeneous electrical field between the RF electrode and the grounded electrode can be formed leading to an inhomogeneous surface processing of the substrates. This effect can be reduced by a change of the edge geometry of the RF electrode.

For this purpose, the showerhead comprises in an embodiment of the present invention elongated vertical side walls forming a vertical surrounding wall of the RF electrode. This quasi-local edge rising formed by elongated vertical or wedged side walls of the showerhead leads to a higher symmetry of the plane proportions between the RF electrode plane and the grounded electrode plane in the edge area of the parallel plate arrangement.

Besides the vertical edge rising, in a relatively similar variant of the present invention the showerhead can comprise elongated wedged side walls. Doing so, an inclined change-over from the inner plane of the RF electrode in the direction of the edge rising can be formed. Thus, the danger of the formation of gas turbulences, especially in the gas transport direction, can be reduced.

In the following, favorite examples of the present invention are described in further detail, wherein

DESCRIPTION OF THE INVENTION

Figure 1:
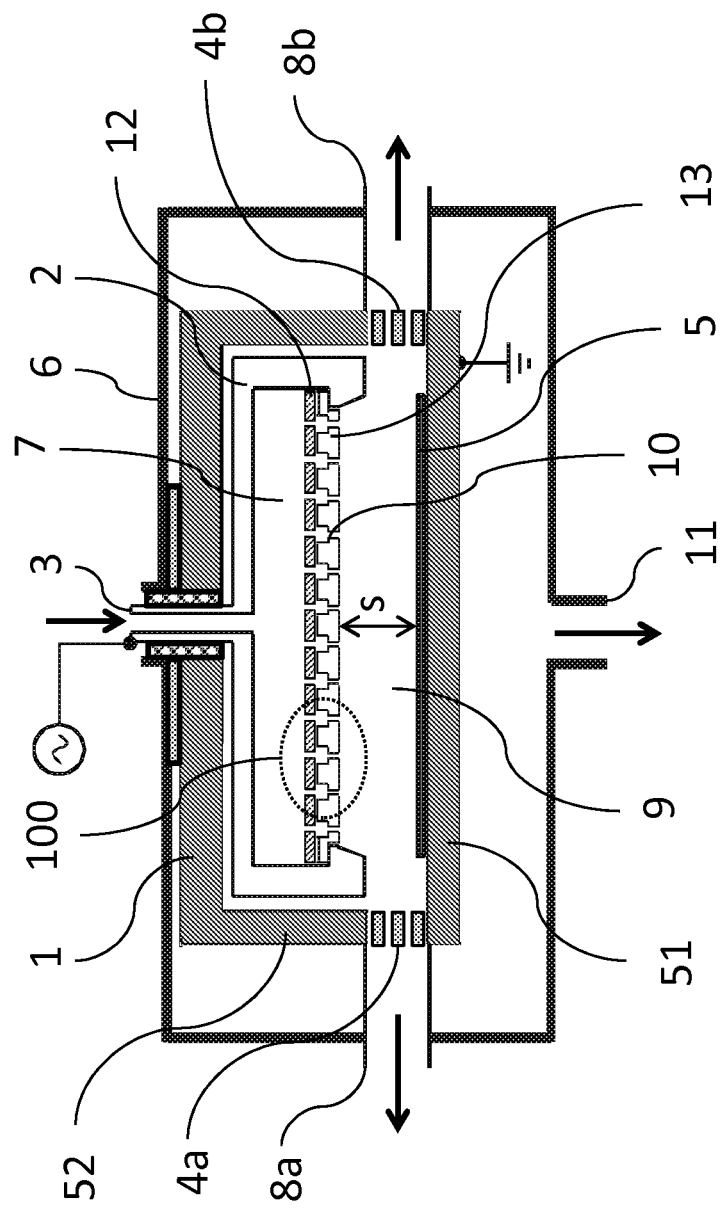
FIG. 1 shows schematically a cut side view of a capacitive-coupled parallel plate reactor according to an embodiment of the present invention.

FIG. 1 shows schematically a cut side view of a capacitive-coupled parallel plate reactor 1 according to an embodiment of the present invention. The parallel plate reactor 1 is in the described example a large area parallel plate reactor for plasma enhanced chemical vapor depositions (PECVD). The reactor 1 is placed in a vacuum chamber 6.

The reactor 1 comprises an RF electrode 2 comprising a gas distribution unit 10. The gas distribution unit 10 is formed as a so-called showerhead and connected with single or multiple gas connections. The gas distribution unit 10 has a special importance in accordance with the present invention. It influences significantly the homogeneity of the plasma processing in the reactor 1. The gas distribution unit 10 consists in the example shown of a first and a second gas distribution plate 12, 13 arranged in parallel in a small distance to each other and will be described in more detail with reference to FIGS. 2 to 4.

The RF electrode 2 has a symmetrical construction and can be connected to single or multiple electrical feedings. Said single or multiple electrical feedings can be flexibly used as gas inlet, as cooling or heating connections of the electrode and/or as mechanical holders of the RF electrode 2. The RF electrode 2 comprises in the shown side view wedged edges 52. On the other not shown sides of the reactor, the RF electrode 2 is formed with vertically elongated edges. The symmetry of the RF electrode 2 is used to ensure a uniform deposition up to the reactor side walls by reducing or eliminating the so-called Telegraph non-uniformity. Wedged edges of the RF electrode 2 are used in the pumping direction of the gas through the reactor to achieve a non-turbulent gas flow within the plasma of the reactor 1, whereas vertically elongated edges for the walls of the RF electrode 2 are preferred on the lateral side, i.e. not in the pumping direction, to avoid any plasma change up to the side walls of the reactor.

At a bottom 51 of the reactor 1, substrates 5 will be laid to deposit at least one layer thereon. The bottom 51 and the electrode 2 are distanced by a space S from each other and terminate, together with pumping grids 4a, 4b provided sideways on the electrode 2, the plasma room 9. An electrode supply 3 serves simultaneously as a RF supply and as gas supply. The electrode supply 3 is electrically insulated and integrated in the reactor 1 as well as in the vacuum chamber 6 in a vacuum-tight manner.

Figure 7:
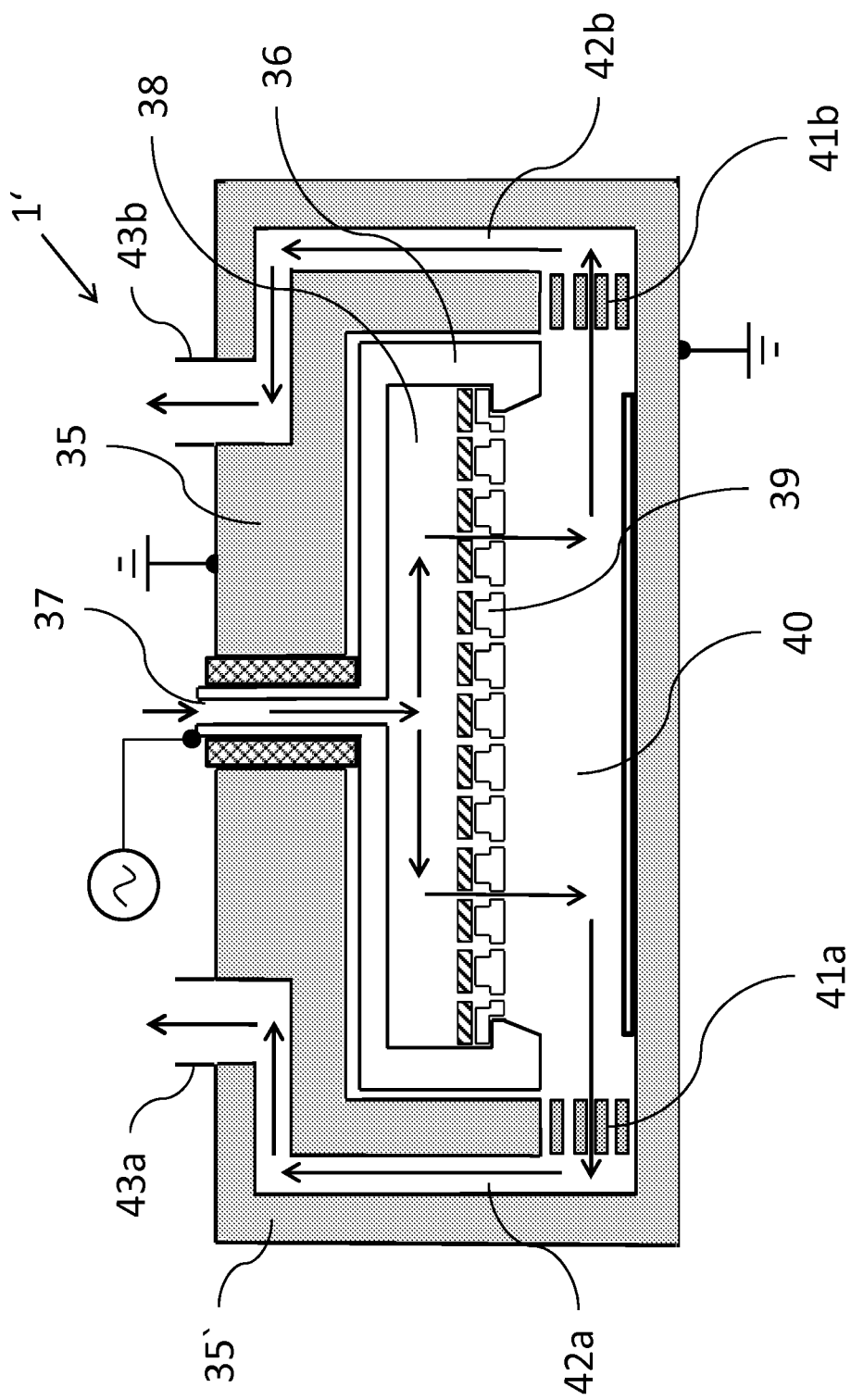
FIG. 7 shows schematically a cut side view of a capacitive-coupled parallel plate reactor according to a yet further embodiment of the present invention.

A gas buffer 7 ensures a continuous gas supply of the individual gas holes of the gas distribution unit 10 without remarkable pressure differences in the gas buffer 7. The vacuum chamber 6 comprises a pumping orifice 11 for a connection with a vacuum pumping system. Further shown pumping orifices 8a, 8b serve for a gas exhaust of used process gases out of the plasma room 9. The pumping orifices 8a, 8b are connected with a separate vacuum pumping system and shall be provided in accordance with the present invention either in the deposition plane as shown in FIG. 1 or on top of the reactor as shown in FIG. 7. The gas pressure in the vacuum chamber 6 is normally in a region between about $10^{-1}$ Pa and $<10^{-4}$ Pa. The process pressure in the parallel plate reactor 1 is in a region from about 1 Pa to several 100 Pa.

As mentioned above, a defined provision of fresh gas and a defined distribution of said gas is very important for PECVD processes in parallel plate reactors, as in the reactor 1 of FIG. 1. The required distribution of fresh gas is on the other hand determined by the technological requirements and the concrete dimensions of the plasma room 9. The technological requirements include the process conditions being necessary to reach a certain quality of the processed substrates, the requirements to the homogeneity of the process and to the process velocity. The process conditions are defined by the choice of the process parameters. Important process parameters are the number and the type of the used gases, the gas flows of the individual gases, the entire gas flow adjusted therewith, the process pressure and the electrical process parameters. Electrical process parameters involve the plasma excitation frequency, the effective electrical power used by the plasma and the special electrical process conditions, for example if a continuous or a pulsed electrical power is used for the plasma formation.

Figure 2:
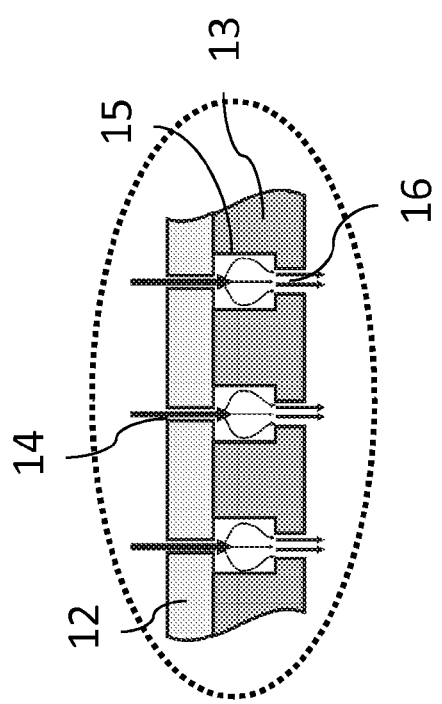
FIG. 2 shows schematically a cut-out of a gas distribution unit of a capacitive-coupled parallel plate reactor according to an embodiment of the present invention.
Figure 3:
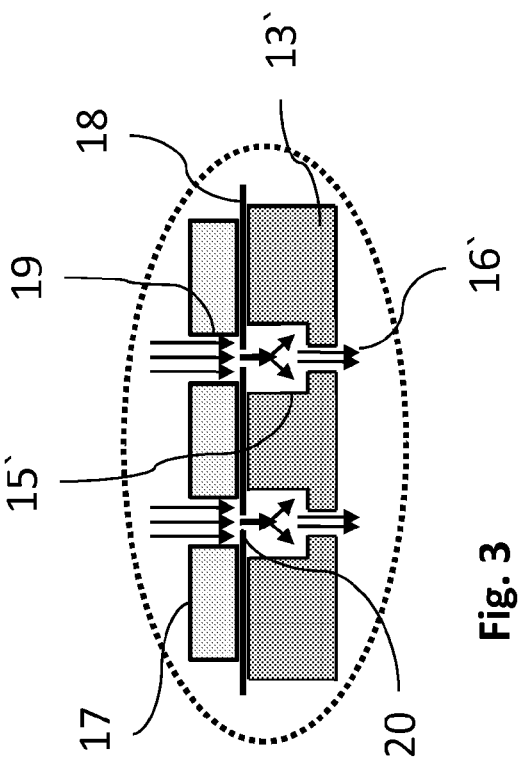
FIG. 3 shows schematically a cut-out of another gas distribution unit of a capacitive-coupled parallel plate reactor according to a second embodiment of the present invention.
Figure 4:
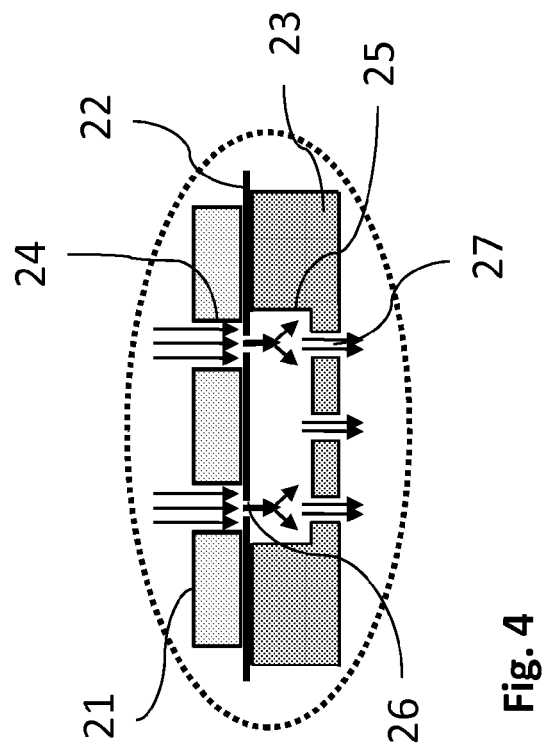
FIG. 4 shows schematically a cut-out of yet another gas distribution unit of a capacitive-coupled parallel plate reactor according to a third embodiment of the present invention.

A necessary adaptation of the gas distribution in dependence on the technological requirements can be advantageously reached by the gas distribution unit 10 used in the present invention. FIGS. 2 to 4 show schematically augmented cut-outs of several options of realization of the region 100 marked in FIG. 1.

FIG. 2 shows a variant with two gas distribution plates 12, 13 lying on top of each other. The first gas distribution plate 12 has a defined holes arrangement with individual holes 14 and defined gas conductance values. The first gas distribution plate 12 acts as gas distribution with a concurrent adjustment of a defined decrease of pressure over this first gas distribution plate 12. Thereby, an overpressure in the gas buffer 7 is created in comparison to the process pressure in the plasma room 9. This overpressure is dependent on entire gas flow through the first gas distribution plate 12.

Is that pressure decrease large enough, the so-called gas blocking effect occurs. In this case, the gas amount flowing through each hole 14 of the first gas distribution plate 12 is only determined by the primary pressure.

The flow velocity of the gas particles in the respective hole 14 changes in dependence on the gas flow through each hole 14, by which the gas emission profile also changes.

This problem is solved by the second gas distribution plate 13. Inside the second gas distribution plate 13, gas buffer volumes 15 are formed. The dimensions of the gas buffer volumes 15 are adjusted in such a way that the cavities of the gas buffer volumes 15 can hold the gas flowing therein from the holes 14 surely without a formation of a remarkable back pressure. The gas buffer volumes 15 are sealed against each other so that no estimable gas exchange is possible between the gas buffer volumes 15. By the extension of the cross-section of the gas buffer volumes 15 in comparison to the holes 14, the velocity of the gas particles is strongly reduced in the gas buffer volumes 15.

The second gas distribution plate 13 which is opposite to the substrates 5 contains holes 16 which are connected with the gas buffer volumes 15. The holes 16 provide an easy adaptation of the gas emission profiles. The gas emission profiles of each of the holes 16 can be configured by a definition of the length and the cross-section of the holes 16 as well as by additional countersinks of the holes 16 on the side of the escape of gas and/or on the side of the gas inlet or by a continuous or stepwise change of the holes diameter.

This inventive construction of the gas distribution unit 10 allows an independent adjustment of the gas distribution and of the gas emission profiles.

The second gas distribution plate 13 can be composed of two or more individual perforated plates or foils. Preferably, each of said plates or foils has a defined arrangement of holes with defined diameters. The thickness of the respective plate or foil determines the respective holes length.

FIG. 3 schematically shows a further development of the arrangement of FIG. 2. Instead of the first gas distribution plate 12, in FIG. 3 a foil 18 is used for a defined adjustment of the decrease of gas pressure to provide the gas blocking effect described above. The foil 18 is fixed by a perforated plate 17 which provides for a defined position and seal of the holes 20 in the foil 18. Furthermore, the perforated plate 17 can predefine the way of the gas through the foil 18 or the number of those holes 20 in the foil 18 which are effective for the definition of the integral gas conductance of the foil 18. For this purpose, the perforated plate 17 can be used as a mask for the foil 18. The gas can only flow through those holes 20 of the foil 18 over which holes 19 of the perforated foil 17 are provided. For this case, it is advantageous that the foil 18 can be formed with a relatively simple and homogeneous pattern of holes 20 with the same density and dimensions of the holes 20. Therefore, an easy adaptation of the integral gas conductance of the first gas distribution plate arrangement, independent from the gas distribution, is possible.

The second gas distribution plate 13', the gas buffer volumes 15' and the holes 16' have the same function as the second gas distribution plate 13, the gas buffer volumes 15 and the holes 16 in FIG. 2.

FIG. 4 shows schematically a further variant of a gas distribution unit usable in the reactor 1 of the present invention. As shown in FIG. 3, a foil 22 is here used together with a perforated plate 21 to adjust the gas blocking effect. In comparison to FIG. 3, not each hole 26 of the foil 22 of FIG. 4 has one corresponding gas buffer volume. Instead, several holes 26 of the foil 22 open out into a common gas buffer volume 25. That gas buffer volume 25 can be a big hole or a specific geometrical notch. Exemplarily, FIG. 4 shows a combination of two holes 26 of the foil 22 discharging in a common gas buffer volume 25.

On the side of the substrates 5, in the example shown, the gas buffer volume 25 is connected with three holes 27 of the second gas distribution plate 23. This variant of a gas distribution unit shows the possibility that it is not absolutely necessary in the present invention to copy the arrangement of holes of the inlet-sided first gas distribution plate on the substrate-sided second gas distribution plate. Thus, there exists the possibility to change the density of holes independent from the gas blocking effect. The number of holes to be combined and the special holes arrangement at the side of the substrates 5 result from the respective technological requirements.

Figure 5:
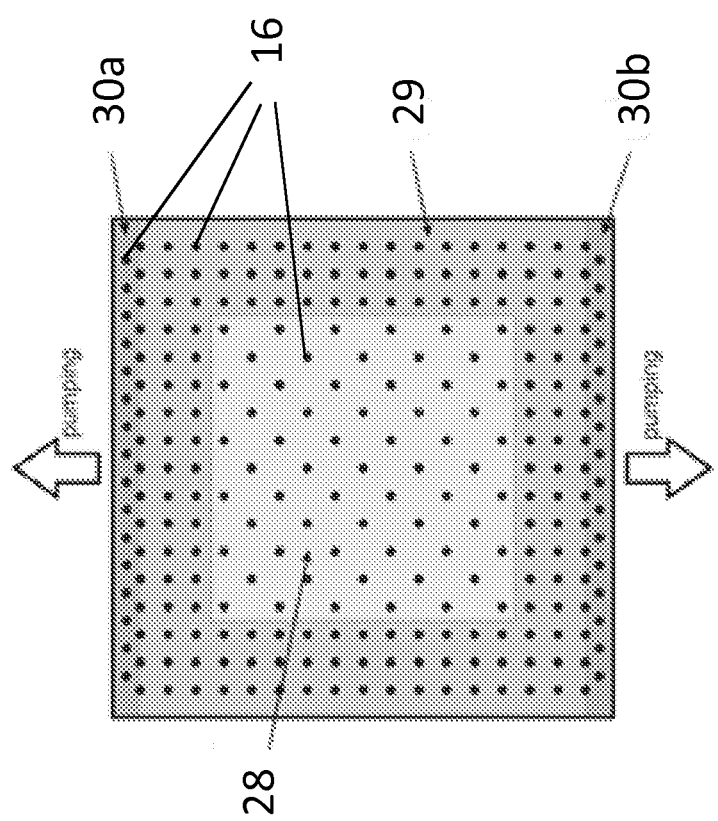
FIG. 5 shows schematically a top view on a hole distribution of a gas distribution plate of a capacitive-coupled parallel plate reactor according to another embodiment of the present invention.

FIG. 5 shows schematically a bottom view of the second gas distribution plate 13 of an RF electrode 2 or a gas distribution unit 10, respectively, as shown in FIG. 1, from the side of the substrates 5. The second gas distribution plate 13 comprises a central region 28 with holes 16 arranged with a relatively low holes density and a surrounding region 29 with a higher holes density. In the direction of the pump down of the gases, further rows 30a, 30b of holes 16 are provided. With changes of the holes density in relation to chosen regions of the RF electrode 2, the necessary supply of fresh gas can be adapted onto the local gas consumption requirements in the plasma process. For example, this allows a correction of the layer characteristics in the edge regions of the substrate electrode or an enhancement of homogeneity of the deposition in the edge regions.

Besides a defined supply of fresh gases, a defined exhaust of used gases is very important for the quality and homogeneity of the plasma processing.

Figure 6:
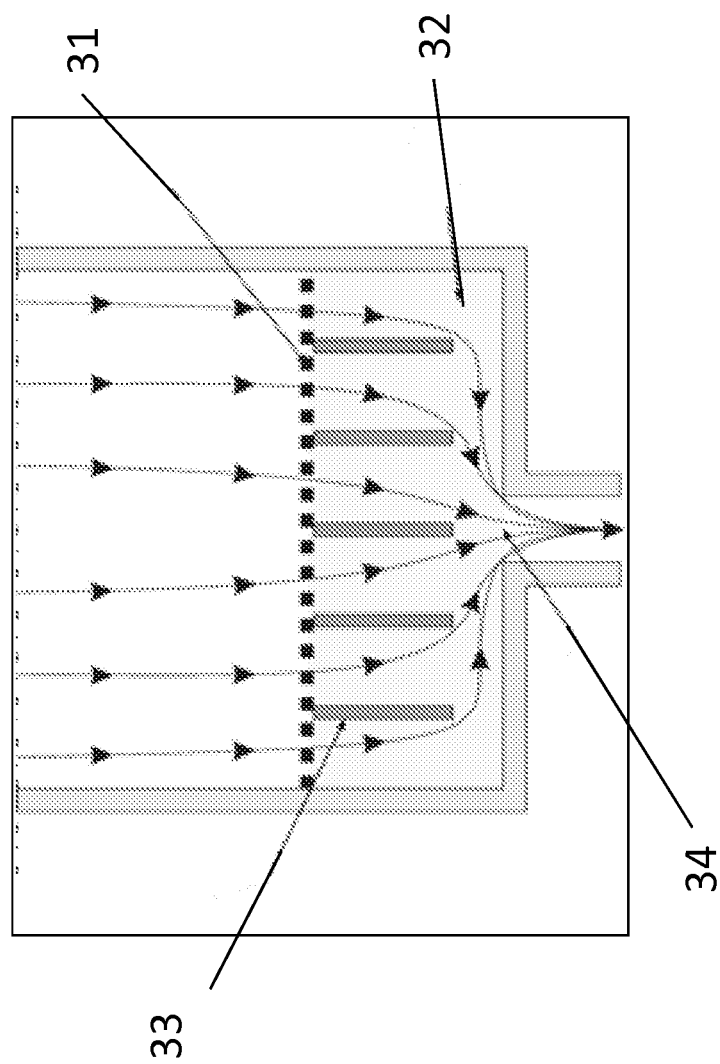
FIG. 6 shows schematically a top view on a region at a pumping grid of a capacitive-coupled parallel plate reactor according to a further embodiment of the present invention.

FIG. 6 shows schematically one half of a view cut through a parallel plate reactor, as the reactor of FIG. 1 or 7, wherein the cut is done in parallel to the RF electrode 2 through a part of the plasma room and the pumping grids. FIG. 6 shows a pumping grid 31, a pumping orifice 34 and several pumping channels 32 being separated by walls 33. The distribution of the exhausted gas on several pumping channels 32 enhances the homogeneity of the gas exhaust out of the plasma room significantly, since the pumping channels 32 avoid disturbances of the gas flow inside the plasma. It is determining for a homogeneous pumping result in the region of the pumping grid 31 that the pumping channels 32 are provided with a same gas conductance up to pumping orifice 34. The gas conductance is defined by the cross-section and the length of the pumping channels 32. A high number of pumping channels 32 promotes the uniformity of the gas exhaust to the pumping orifice 34.

FIG. 7 shows schematically a further variant for a compact integration of pumping channels 42a, 42b in walls 35, 35' of a parallel plate reactor 1' in accordance with the present invention. The process gases are supplied in this variant by an electrode supply 37 into a gas buffer 38 of an RF electrode 36. The gases flow through the integrated gas distribution unit 39 of the RF electrode 36 into a process room 40. Thereafter, the gases are pumped out of the process room 40 through pumping grids 41a, 41b provided sideways on the RF electrode 36, respectively. For this purpose, pumping orifices provided in the example shown on top of the reactor 1' are connected with a suitable pumping system.

The throughput of a vacuum pump of said pumping system is then lead through the pumping channels 42a, 42b to the pumping grids 41a, 41b. As shown in FIG. 6, the pumping channels 42a, 42b are formed by several individual channels. By the gas exhaust through the walls 35, 35' of the parallel plate reactor 1', the pumping channels 42a, 42b can be formed very space-saving and compact. The direction of the gas exhaust can be adapted onto the special design of the reactor 1'.

In the example shown in FIG. 7, the gas exhaust is directed to the top of the reactor 1', close to the centre of the RF electrode 36. In other not shown embodiments of the present invention it is also possible to lead the gas to a region at the bottom or to the sidewalls of the parallel plate reactor. The latter alternatives have, however, the disadvantage that a laborious processing of the pumping channels is necessary and that the pumping channels have to be made with certain minimum length.

Figures 8, 9:
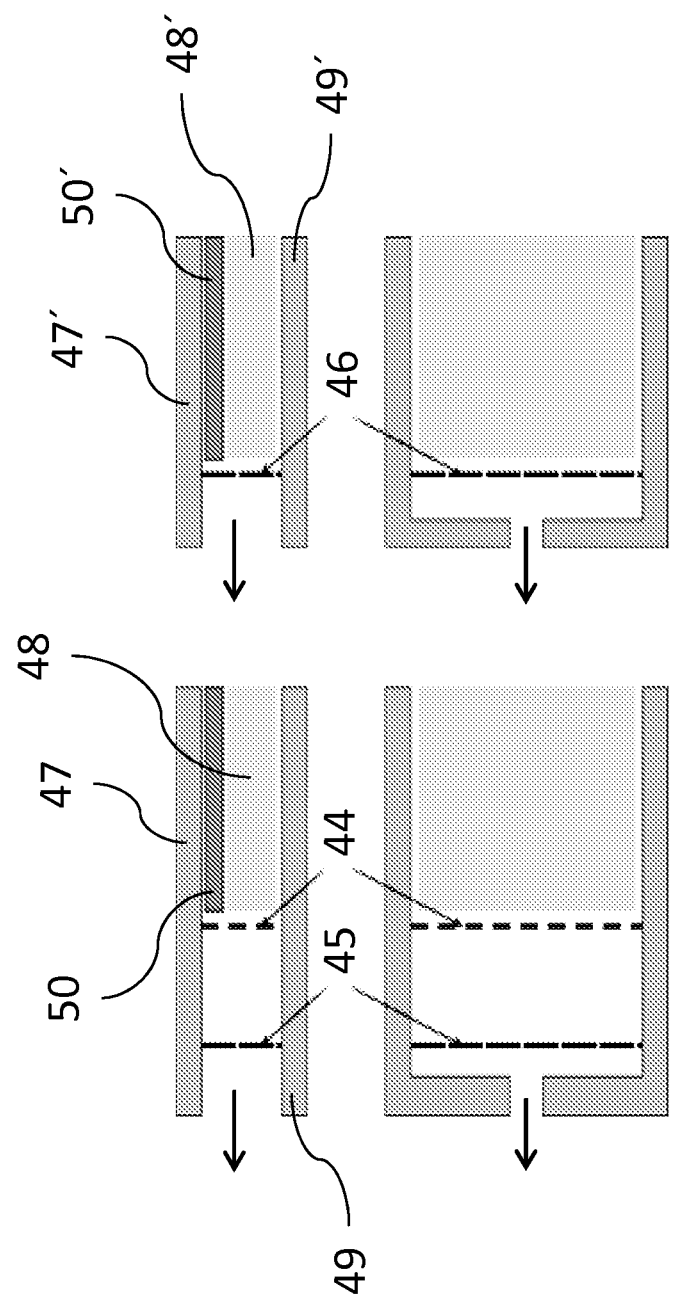
FIG. 8 shows schematically a cut side view of a region at a pumping grid of a capacitive-coupled parallel plate reactor according to a further embodiment of the present invention.
FIG. 9 shows schematically a cut side view of a region at another pumping grid of a capacitive-coupled parallel plate reactor according to another embodiment of the present invention.

FIG. 8 shows schematically two cut-out views of a parallel plate reactor in accordance with the present invention. The upper view shows one half of a vertical cut, and the lower view is a top view on a cut through a plasma room 48 of the reactor. An RF electrode 50, a pumping grid 44 and an additional grid 45 are provided between a bottom 49 and an upper wall 47 of the reactor. The RF electrode 50 and the bottom 49 form the plasma room 48. The plasma room 48 is delimited in the direction of pump down of the gases by the pumping grid 44. The additional grid 45 is arranged in the direction of the pump down of the gases, which is shown by the arrows in FIG. 8, directly behind the pumping grid 44.

By a defined configuration of the additional grid 45 leading to a defined gas conductance of the additional grid 45 and in dependence on the entire gas flow, a defined decrease of pressure can be achieved on the additional grid 45. For example, the additional grid 45 can be formed with a defined number of suited holes or slits with defined gas conductance values. In a case in which there is such a decrease of pressure on the additional grid 45 that a gas blocking effect occurs, the pumping grid 44 causes concurrently a homogenization of the gas exhaustion. The material of the additional grid 45 can be adapted onto the respective mechanical and/or chemical requirements, since there are no demands on the electrical conductivity of the additional grid 45.

In principle, the pumping grids 44 can also take over the function to attain a gas blocking effect. However, this is disadvantageous in depositing plasma processes, since in such a case the pumping grids 45 will also be deposited. Thus, a change of the gas conductance of the pumping grids 45 arises leading to an undefined change of the process parameters. FIG. 9 shows schematically such an arrangement, wherein the similar details of the construction of FIG. 9 are similarly referenced as in FIG. 8. The pumping grid 46 serves in that construction as a gas conductance plate providing a gas blocking effect like the additional grid 45 of FIG. 8 provided that the pumping grid 46 of FIG. 9 consists of an electrically conducting material.

Thus, the gas blocking effect is used in embodiments of the present invention during the supply of fresh gases as well as during the exhaust of used gases out of the process room to the best advantage.

The present invention makes it possible to deposit layers on substrates with a high thickness uniformity, wherein the gas flow at the gas inlet and/or at the gas outlet is well controllable, in particular by the gas blocking effect. The present invention makes it possible to increase the usable area for a large area deposition and to reduce the gas precursor needs for a given throughput. As a consequence, the source gas consumption as well as the foot-print of the deposition tool can be reduced leading to cost of ownership improvement.

The invention claimed is:

1. A capacitive-coupled parallel plate plasma enhanced chemical vapor deposition reactor, comprising:
   an electrode supply, a gas distribution unit integrated in an RF electrode, and a gas buffer located above said gas distribution unit;
   at least one gas outlet;
   said gas distribution unit having a multiple-stage showerhead constructed to provide for an independent adjustment of gas distribution and gas emission profile of said gas distribution unit;
   said gas distribution unit having, in a direction of a gas flow through the reactor, at least one perforated first gas distribution plate formed with holes and at least one perforated second gas distribution plate formed with holes and disposed at a spacing distance from said first gas distribution plate, said holes in said second gas distribution plate having a larger cross-section than said holes in said first gas distribution plate, wherein said first gas distribution plate has a gas flow conductance configured to produce a decrease of a gas pressure necessary to attain a gas blocking effect by said first gas distribution plate; and a plurality of separated gas buffer volumes formed between individual holes or groups of holes of said first gas distribution plate and said second gas distribution plate, each of said gas buffer volumes connecting said individual holes or one of said groups of holes of said first gas distribution plate with a plurality of said holes combined at a side of a substrate of said second gas distribution plate, and said gas buffer volumes having a larger cross-section than said holes in said second gas distribution plate;

a perforated plate being a part of said at least one perforated first gas distribution plate;

wherein said electrode supply is connected to said gas buffer to supply process gases into said gas buffer, and said gas buffer is connected to said holes in said first gas distribution plate to ensure a continuous gas supply thereto; and wherein said first gas distribution plate includes a perforated foil with holes, said perforated foil fixed by said perforated plate, said perforated plate forming a mask for said foil so that the gas can only flow through those holes of said perforated foil over which holes of said perforated plate are provided;

wherein said plurality of separated gas buffer volumes is located downstream from said first gas distribution plate in the direction of the gas flow through the reactor.

2. The reactor according to claim 1, wherein said holes in said second gas distribution plate comprise countersinks on a side of an escape of gas and/or on a side of a gas inlet.

3. The reactor according to claim 1, wherein a hole density in said second gas distribution plate is higher at edges of said gas distribution plate in a region close to pumping grids provided sideways of said RF electrode, respectively, than at a central part of said second gas distribution plate.

4. The reactor according to claim 1, wherein additional rows of holes of said gas distribution plates are provided at an outer edge of said gas distribution unit, in a direction of said at least one gas outlet of the reactor.

5. The reactor according to claim 1, which comprises gas pump down channels extending in a direction of the gas flow through the reactor between pumping grids provided sideways of said RF electrode, respectively, and said at least one gas outlet of the reactor.

6. The reactor according to claim 5, wherein said gas pump down channels are formed by a plurality of parallel gas deflectors provided in the direction of the gas flow through the reactor behind said pumping grids.

7. The reactor according to claim 5, wherein said gas pump down channels are integrated in at least one wall of the reactor.

8. The reactor according to claim 1, which comprises at least one additional grid provided between pumping grids disposed sideways of said RF electrode, respectively, and said gas outlet of the reactor, said at least one additional grid having a reduced gas flow conductance compared with the pumping grids.

9. The reactor according to claim 8, wherein said at least one additional grid has such a gas flow conductance that the respective grid is configured to produce a decrease of gas pressure necessary to attain a gas blocking effect.

10. The reactor according to claim 1, which comprises pumping grids laterally of said electrode, said pumping grids having a gas flow conductance causing a decrease of gas pressure necessary to attain a gas blocking effect by said grids.

* * * * *